United States Patent [19]

Mackenzie

[11] Patent Number: 4,663,587

[45] Date of Patent: May 5, 1987

[54] ELECTRONIC CIRCUIT FOR MEASURING ELECTRICAL ENERGY

[75] Inventor: Raymond W. Mackenzie, Baldwin Boro, Pa.

[73] Assignee: Westinghouse Electric Corp., Pittsburgh, Pa.

[21] Appl. No.: 782,772

[22] Filed: Oct. 2, 1985

[51] Int. Cl.$^4$ ............................................. G01R 21/06
[52] U.S. Cl. .................................... 324/141; 324/142; 364/483
[58] Field of Search ................ 324/141, 142; 364/483, 364/842; 328/160

[56] References Cited

U.S. PATENT DOCUMENTS

| | | |
|---|---|---|
| 3,226,641 | 12/1965 | Miller ................................. 324/142 |
| 4,124,821 | 11/1978 | Petr . |
| 4,182,983 | 1/1980 | Heinrich et al. . |
| 4,242,634 | 12/1980 | Metcalf . |
| 4,254,376 | 3/1981 | Steinmuller . |
| 4,315,212 | 2/1982 | Gamoh . |
| 4,368,424 | 1/1983 | Miller . |
| 4,463,311 | 7/1984 | Kobayashi . |
| 4,596,951 | 6/1986 | Heinrich et al. ................... 324/142 |

Primary Examiner—Ernest F. Karlsen
Attorney, Agent, or Firm—D. R. Lackey

[57] ABSTRACT

A shift register is utilized to provide a 90° delay in a pulse width modulated current signal to determine volt-amperes reactive. The shift register is associated with a clock that provides a preselected frequency that, in combination with the number of stages in the shift register, delays the pulse width modulated current signal by an amount equivalent to one-quarter period of the current waveform in the metered circuit. After delaying the pulse width modulated signal by 90°, the shifted signal is multiplied by a voltage signal that represents the voltage in the metered circuit and the resulting product signal is input to a voltage-to-frequency converter.

9 Claims, 4 Drawing Figures

ELECTRONIC CIRCUIT FOR MEASURING
ELECTRICAL ENERGY

BACKGROUND AND SUMMARY OF THE
INVENTION

The present invention relates generally to an electronic circuit for measuring AC electrical energy and, more particularly, for measuring volt-amperes reactive (VAR's).

It is known to those skilled in the art to provide electronic circuits for measuring AC electrical energy. In one particular type of electronic circuit, a multiplier circuit is used to produce signals that are responsive to the product of the current and voltage of the metered circuit. A voltage-to-frequency converter can be used to provide an output signal that is responsive to the magnitude of this product.

There are various ways known to those skilled in the art for forming this signal that is representative of the product of current and voltage. U.S. Pat. No. 4,242,634, which issued on Dec. 30, 1980 to Metcalf, discloses an electronic multiplying circuit that is intended for use in an electronic watthour meter. This particular circuit comprises a variable-transconductance multiplier of the type comprising two emitter-coupled pairs of transistors with the collectors of one pair being cross-coupled with the collectors of the other pair. In order to permit the effective polarity of one of the input signals to the multiplier to be reversed from time to time for drift correction purposes, this input signal is applied to a semiconductor switching circuit which applies it alternately to the respective bases of a further emitter-coupled pair of transistors. The collectors of the transistors of this further pair are connected in series with the coupled emitters of respective ones of the emitter-coupled pairs in the variable-transconductance multiplier.

U.S. Pat. No. 4,254,376, which issued on Mar. 3, 1981 to Steinmuller, discloses an apparatus for measuring the electric power or energy in an AC network. This apparatus comprises a multiplying device that is operated according to the principle of pulse duration-pulse height modulation. Variables that are proportional to the load current and the load voltage are taken directly from the load current and the load voltage respectively.

U.S. Pat. No. 4,315,212, which issued on Feb. 9, 1982 to Gamoh, discloses an electronic watthour meter comprising a pulse width modulation circuit for subjecting a voltage signal, which is proportional to the load voltage of a power supply line, to pulse width modulation to obtain a pulse width duty cycle signal. A multiplication circuit comprises a plurality of analog switches that are selectively operated, with the aid of the pulse width duty cycle signal, so that positive and negative DC voltages that are equal in absolute value are obtained from the product of a voltage signal which is proportional to the consumption current of the power supply line and the pulse width duty cycle signal that is representative of the voltage signal proportional to the load voltage. It further comprises a dual-slope type frequency conversion circuit for converting the positive and negative DC voltages into a frequency signal.

U.S. Pat. No. 4,182,983, which issued on Jan. 8, 1980 to Heinrich et al, discloses an electronic AC electric energy measuring circuit that converts a di/dt analog input signal into a pulse width modulated signal responsive to the amplitude of a current component of an alternating current energy quantity to be measured. The pulse width modulated (PWM) signal is produced by a first modulator circuit including an integrator circuit deriving both a modulating frequency signal and a current analog signal proportional to the current component. A multiplying circuit receives a voltage analog input signal and applies it to a reference input of a second modulator signal. The modulating control of the second modulator circuit receives the pulse width modulated signal so that the multiplying circuit produces a variable amplitude and pulse width modulated signal having an average value equal to an average power measurement. An analog to frequency converter including a second integrator circuit receives the output of the multiplying circuit to produce an output pulse representative of a quantized amount of electric energy.

U.S. Pat. No 463,311, which issued on July 31, 1984 to Koboyoshi, discloses an electronic electric energy meter that comprises a delay time setting circuit that is connected to one of a voltage transformer and a current transformer that are, in turn, connected to power lines for providing a necessary delay time and a delay circuit. One embodiment of this electronic meter utilizes a shift register to provide a preselected time delay to a pulse width modulated signal. A constant frequency clock is used to control the speed of data through the shift register and various time delays are obtained by outputting the pulse width modulated signal from different stages of the shift register. To increase the time delay, the pulse width modulated signal is caused to be output from later stages of the shift register and, conversely, to decrease the time delay the pulse width modulated signal is caused to be output from earlier stages of the shift register. By properly selecting the chosen output stage of the shift register, the pulse width modulated current signal can be delayed by an output of time equivalent to 90° phase shift of the signal.

U.S. patent application Ser. No. 590,110, which was filed on Mar. 9, 1984 by Mackenzie et al and assigned to the assignee of the present application, discloses a pulse width modulator for an electronic kilowatt-hour meter that includes an integrator having its inputs connected to a squarewave clock signal and a sine wave signal proportional to the time derivative of current (di/dt) on a metered circuit. It comprises a plurality of series-connected inverters that are connected to the output of the integrator to operate as a comparator which generates a pulse width modulated signal having a duty cycle proportional to metered current. It provides a negative feedback path that includes a low pass filter which is connected between the output of the last inverter and an input to the integrator to compensate for errors produced by the integrator and inverters.

U.S. Pat. No. 4,124,821, which issued on Nov. 7, 1978 to Petr, discloses an analog-to-frequency converter for developing an output signal of frequency proportional to a measuring current or voltage by the charge quantity compensation method. This type of analog- to-frequency converter is suitable for use in an electronic meter for converting an analog quantity, such as a voltage signal representing the product of voltage and current in a metered circuit, to a series of pulses whose frequency is proportional to an input signal.

U.S. patent application Ser. No. 591,139, now U.S. Pat. No. 4,596,951, which was filed on Mar. 19, 1984 by Heinrich et al and assigned to the assignee of the present application discloses an electronic circuit for a solid state electrical energy meter that has a pair of mutual inductance current transformers, a pulse width modulation circuit, an analog switch and a voltage-to-frequency converter. The pulse width modulation circuit includes an integrator that has a first operational amplifier with a feedback circuit providing a constant DC gain and a variable gain at the power frequency. The pulse width modulation circuit also includes a second operational amplifier that is configured as a comparator and connected to the first operational amplifier so that the reference level of the comparator is proportional to the average DC output of the first operational amplifier. It further comprises summing resistors that are connected to the input of the integrator and are of like value and formed in a common array.

In certain metering applications, it is desirable to measure the volt-amperes reactive (VAR's) to more properly charge the consumer for the amount of electrical energy consumed during a particular billing period. The present invention relates specifically to an electronic circuit that is usable within an electronic electric energy measuring circuit for the purposes of measuring voltamperes reactive.

The metering apparatus of the present invention comprises a current input means for providing a signal that is proportional to the time derivative of an alternating current (di/dt) in the metered circuit. This current input means can comprise an air core transformer. U.S. Pat. No. 4,368,424, which issued on Jan. 11, 1983 to Miller, discloses a transducer which is suitable for the purpose of providing a signal that is proportional to the time derivative of an alternating current. An integrating pulse width modulator (PWM) utilizes this time derivative signal, in conjunction with a clock that provides a series of periodic clock pulses, to produce an output signal that is a pulse width modulated waveform whose duty cycle is representative of the current magnitude in the metered circuit.

This pulse width modulated signal can be multiplied by a voltage signal that is representative of the magnitude of the voltage of the metered circuit. A voltage-to-frequency converter can be used to provide signal pulses representative of the magnitude of the product signal.

In the present invention, a means is provided for delaying the pulse width modulated signal, which is representative of the current magnitude of the metered circuit, by a predetermined amount of time. In a preferred embodiment of the present invention, this delaying means comprises a shift register that digitally shifts the pulse width modulated current signal. In conjunction with the shift register, the present invention utilizes a clock that controls the rate by which the data in the shift register is shifted. This clock provides a series of pulses whose frequency is determined as a function of the power line frequency. The frequency of this clock and the number of stages in the shift register are interrelated and are preselected to cause the pulse width modulated signal to be shifted by a preselected amount which, in the preferred embodiment of the present invention, represents a 90° delay relative to the pulse width modulated signal that is representative of the current in the metered circuit.

The present invention also provides a voltage input means whose output is a signal that is proportional to the voltage of the metered circuit. This voltage input means can be a potential transformer whose turns ratio is suitable to reduce the metered voltage to a magnitude suitable for the other components of the electronic metering circuit. The signal from the voltage input means is multiplied by the shifted pulse width modulated signal to provide a signal that is representative of the magnitude of volt-amperes reactive (VAR's). This VAR signal is input to a voltage-to-frequency converter which produces a series of pulses representative of its input signal. In a preferred embodiment of the present invention, this frequency signal is input to a counter that accumulates its pulses to obtain a count representative of VARH's.

BRIEF DESCRIPTION OF THE DRAWING

The present invention will be more fully understood from a reading of the description of the preferred embodiment in conjunction with the drawing, in which.

DESCRIPTION OF THE PREFERRED EMBODIMENT

Figure 1:
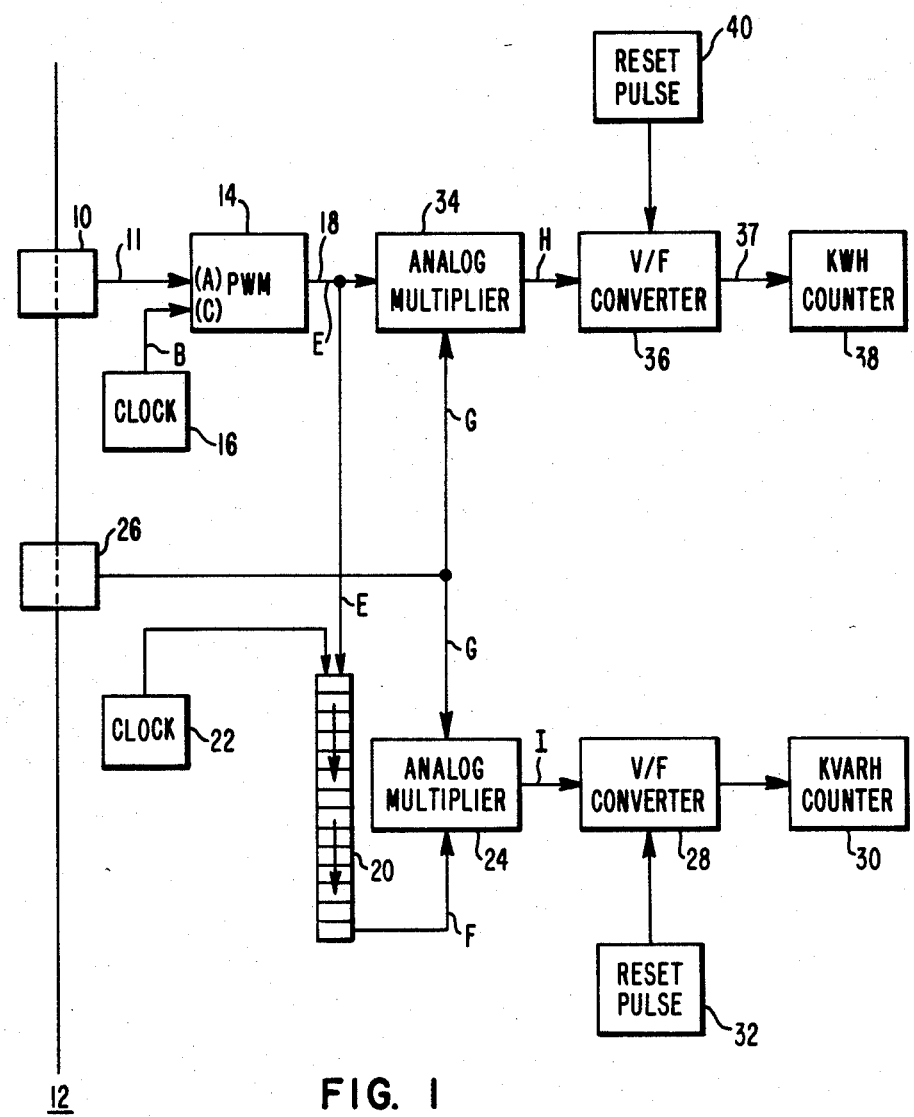
FIG. 1 is a schematic block diagram of the present invention.

FIG. 1 illustrates a schematic diagram of the present invention. A current input means 10, such as an air core transformer, is connected to a metered electric circuit 12 for purposes of providing a signal that is proportional to the time derivative (di/dt) of the AC current in the metered circuit 12. This signal is sent to an integrating pulse width modulator (PWM) 14 which utilizes it to modulate a timing signal received from a clock 16.

It should be understood that, although the present invention most particularly relates to the portion of the circuit in FIG. 1 that pertains to the measurement of volt-amperes reactive (VAR's), FIG. 1 also illustrates the metering circuit for determining watts. The pulse width modulated signal, on line 18, is sent to a shift register 20. This shift register 20 is associated with a clock 22 which provides a series of pulses whose frequency is coordinated with the frequency of the metered circuit 12. In a preferred embodiment of the present invention, the number of stages in the shift register 20 is functionally associated with the frequency signal provided by the clock 22 so that the passage of the pulse width modulated signal through the shift register 20 is delayed by a time period that is equivalent to 90°. Therefore, the digital representation of the pulse width modulated signal that is output from the shift register 20 to the analog multiplier 24 is delayed, relative to the pulse width modulated signal output by the modulator 14, by an amount equivalent to one-quarter of the period of the metered current in the circuit 12 (i.e $\pi/2$ radians).

In order to achieve this 90° delay, the preferred embodiment of the present invention utilizes a shift register 20 that has 22.5 stages and a clock 22 that provides a series of pulses with a frequency of 5,280 Hz when the circuit 12 exhibits of frequency of exactly 60 Hz. This relationship is expressed in Equation 1.

$$f_{clock} = (N - \tfrac{1}{2}) \times 4 \times f_{circuit} \tag{1}$$

In Equation 1, the frequency, $f_{clock}$, provided by the clock 22, is equal to the number of stages N of the shift register 20 minus ½, multiplied by four times the circuit frequency $f_{circuit}$ in the metered circuit 12. The number "4" in Equation 1 results in a delay equivalent to one-fourth of the full period of the pulse width modulated signal. This is equivalent to a 90° shift, or delay, of the pulse width modulated signal that is output from the pulse width modulator. It should be understood that many different alternative numbers of stages N of the shift register 20 are possible within the scope of the present invention. The specific number of stages N are determinative of the required clock frequency $f_{clock}$ for any given circuit frequency $f_{circuit}$.

The delayed pulse width modulated signal is sent to an analog multiplier 24 where it is multiplied by a voltage signal received from a voltage input means 26 that can be a potential transformer. The turns ratio and other physical characteristics of the potential transformer 26 are functionally related to the metered circuit 12 and the particular components chosen to implement the circuit in FIG. 1. For example, the turns ratio of a potential transformer used as the voltage input means 26 is chosen to reduce the voltage of the metered circuit 12 to a suitable magnitude for use with the analog multiplier 24.

The output of the analog multiplier 24 is a voltage signal that is representative of the product of the voltage of the metered circuit 12 and the phase shifted current received from the shift register 20. This product signal is then input to a voltage-to-frequency converter 28 that provides a series of pulses whose frequency represents the product signal received from the analog multiplier 24. This frequency signal is output to a KVARH counter 30 which accumulates the pulses for purposes of monitoring the volt-amperes reactive of the circuit 12.

A reset pulse 32 is provided to the voltage-to-frequency converter 28 in order to provide a fixed charge to reset the integrator. The input signal from the multiplier is used to discharge the integrating capacitor. When discharge is sensed by a level detector, another reset pulse is provided.

Although not a necessary element of the present invention, FIG. 1 also illustrates the use of the pulse width modulated signal from the modulator 14 to provide a watt measurement. This use of the pulse width modulated signal is generally similar to the one described above and used for the volt-amperes reactive (VAR's) measurement, but does not utilize a delayed signal. The pulse width modulated signal from the modulator 14 is sent to an analog multiplier 34 which multiplies it by a voltage signal received from the voltage input means 26. This multiplication technique is similar to that described above in conjunction with the multiplier 24 and results in a signal that is representative of the product of the metered current and metered voltage. This product signal is input to a voltage-to-frequency converter 36 that provides an output signal comprising a plurality of pulses wherein each pulse represents a predetermined quantum of energy consumption. This signal is connected to a KWH counter 38 for purposes of accumulating the pulses from the voltage-to-frequency converter and measuring the energy consumption of the metered circuit 12.

Figure 2:
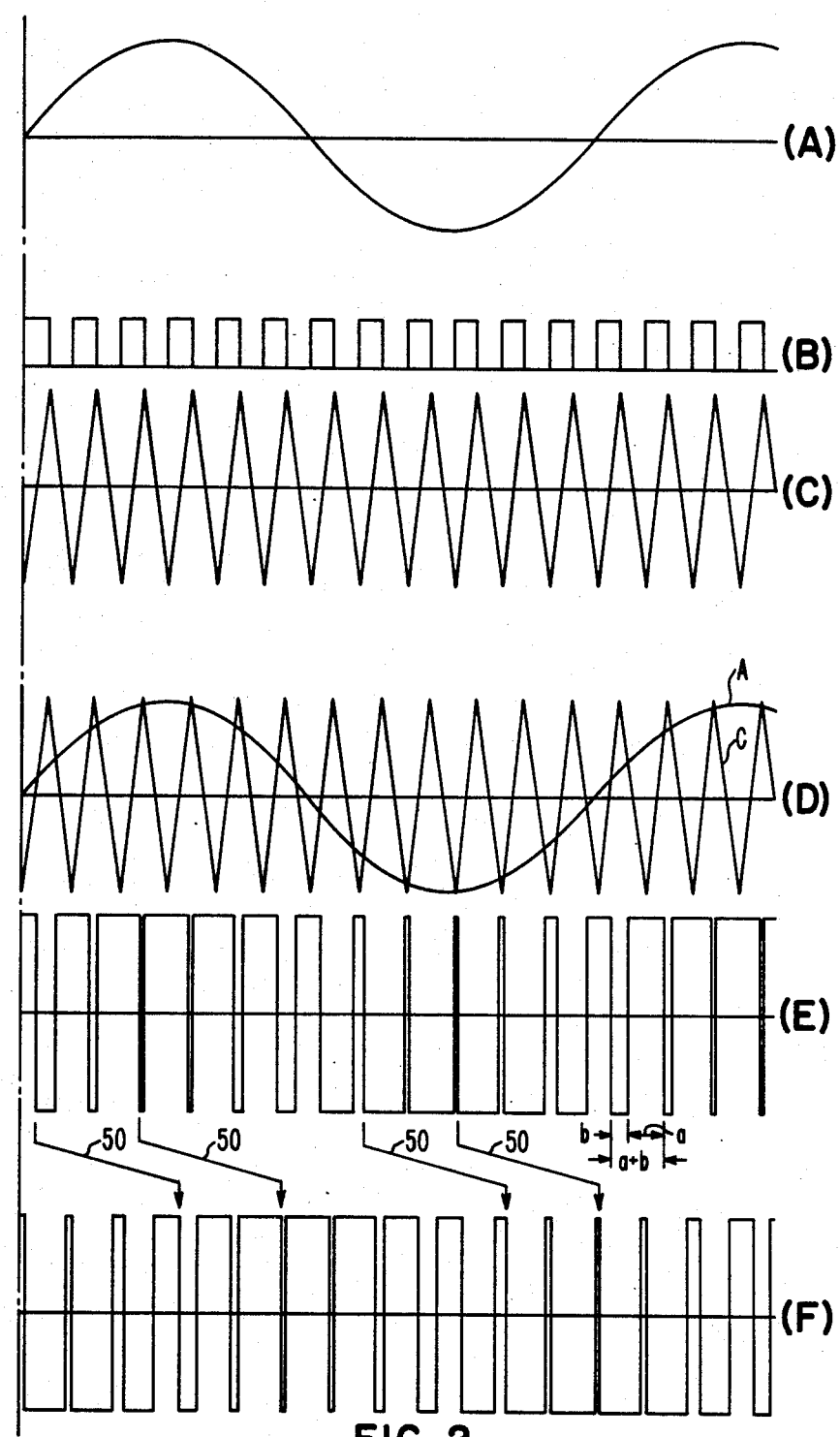
FIG. 2 represents various exemplary waveforms that occur at selected points in the diagram of FIG. 1.
Figure 3:
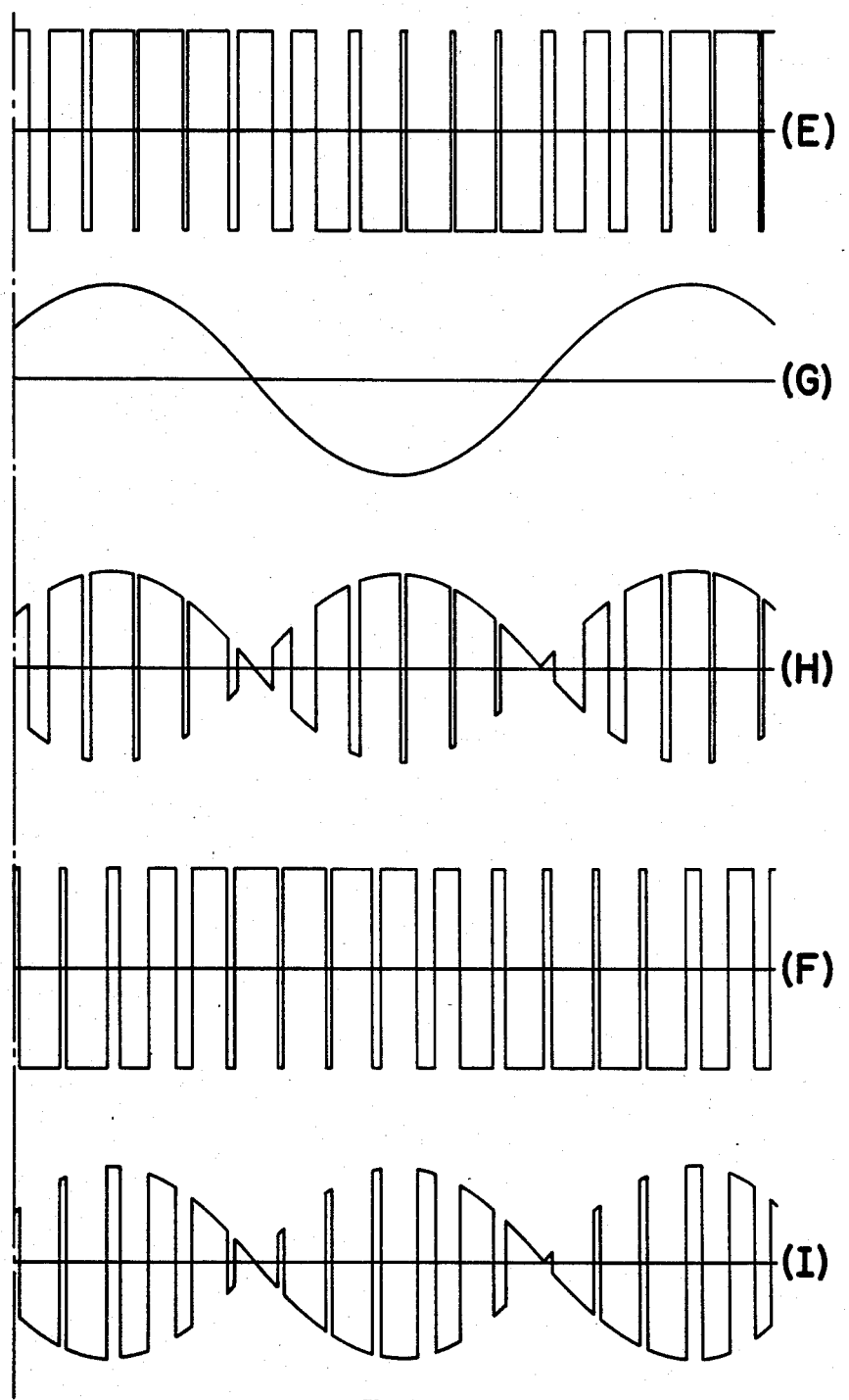
FIG. 3 represents various other exemplary waveforms that occur at selected points in the circuit of FIG. 1.

In order to more fully describe the present invention, waveforms at preselected portions of the circuit shown in FIG. 1 are illustrated in FIGS. 2 and 3. The present invention will be described in conjunction with FIGS. 1, 2 and 3. As discussed above, the current input means 10 provides a signal that is proportional to the time derivative (di/dt) of the current in the metered circuit 12. This time derivative signal is integrated within the integrating pulse width modulator 14 to result in a generally sinusoidal waveform as illustrated by curve A in FIG. 2. This waveform A is representative of the current waveform of the metered circuit 12. Since waveform A represents the integral of the time derivative signal received, on line 11, by the pulse width modulator 14, it should be understood that it is phase shifted relative to the time derivative signal (di/dt).

The clock 16 of FIG. 1 provides a series of pulses, illustrated by waveform B in FIG. 2, of a preselected constant frequency. In a preferred embodiment of the present invention, this frequency is chosen to be 683 Hz to provide a signal that is asynchronous with the current signal A, which is nominally 60 Hz. The clock pulses B are integrated to form the triangular signal C illustrated in FIG. 2. Waveform A is used to modulate waveform C to form a pulse width modulated signal that is output, on line 18, from the pulse width modulator 14. Waveform D in FIG. 2 illustrates the combination of these two signals, A and C, and waveform E shows the resulting modulated signal that is output from the pulse width modulator 14. As should be apparent to one skilled in the art, the high and low signals in the pulse width modulated signal E relate to the magnitude of the current waveform A. For example, as illustrated with waveform E in FIG. 2, the width "a" of the high signal is related to the width "b" of the low signal in such a way that the fraction $a/(a+b)$ represents a value that is proportional to the magnitude of the current at that portion of the waveform. The pulse width modulated signal E is input to the shift register 20. As the pulse width modulated signal passes through the shift register 20, it experiences a delay that is equivalent to one-quarter cycle, $\pi/2$ radians, of the current waveform A. This results in the delayed aveform F that is sent to the analog multiplier 24. As shown in FIG. 2, by arrows 50, waveform F is identical to waveform E, but is shifted by 90° or one-fourth of the period of waveform A.

For purposes of more clearly describing the use of waveforms E and F, they are also shown in FIG. 3 in conjunction with other related waveforms. In order to determine the kilowatt-hours used by the metered circuit 12, waveform E is multiplied by the voltage signal G received from the voltage input means 26. This multiplication results in the product signal H that represents the product of the voltage (waveform G) and pulse width modulated signal of the current (waveform E). Signal H is input to the voltage-to-frequency converter 36 and a resulting series of pulses are input, on line 37, to the kilowatt-hour counter 38.

The shifted pulse width modulated signal (waveform F) is also illustrated in FIG. 3. It is used by the present invention to be multiplied by the voltage waveform G by the analog multiplier 24. This results in a product signal (waveform I) that represents the product of the voltage (waveform G) and the delayed pulse width modulated current signal (waveform F). This product signal is sent to the voltage-to-frequency converter 28 and a resulting series of pulses is output to the KVARH counter 30 for purposes of accumulating a pulse count that is representative of the volt-amperes reactive hours (VARH's) of the metered circuit 12.

Figure 4:
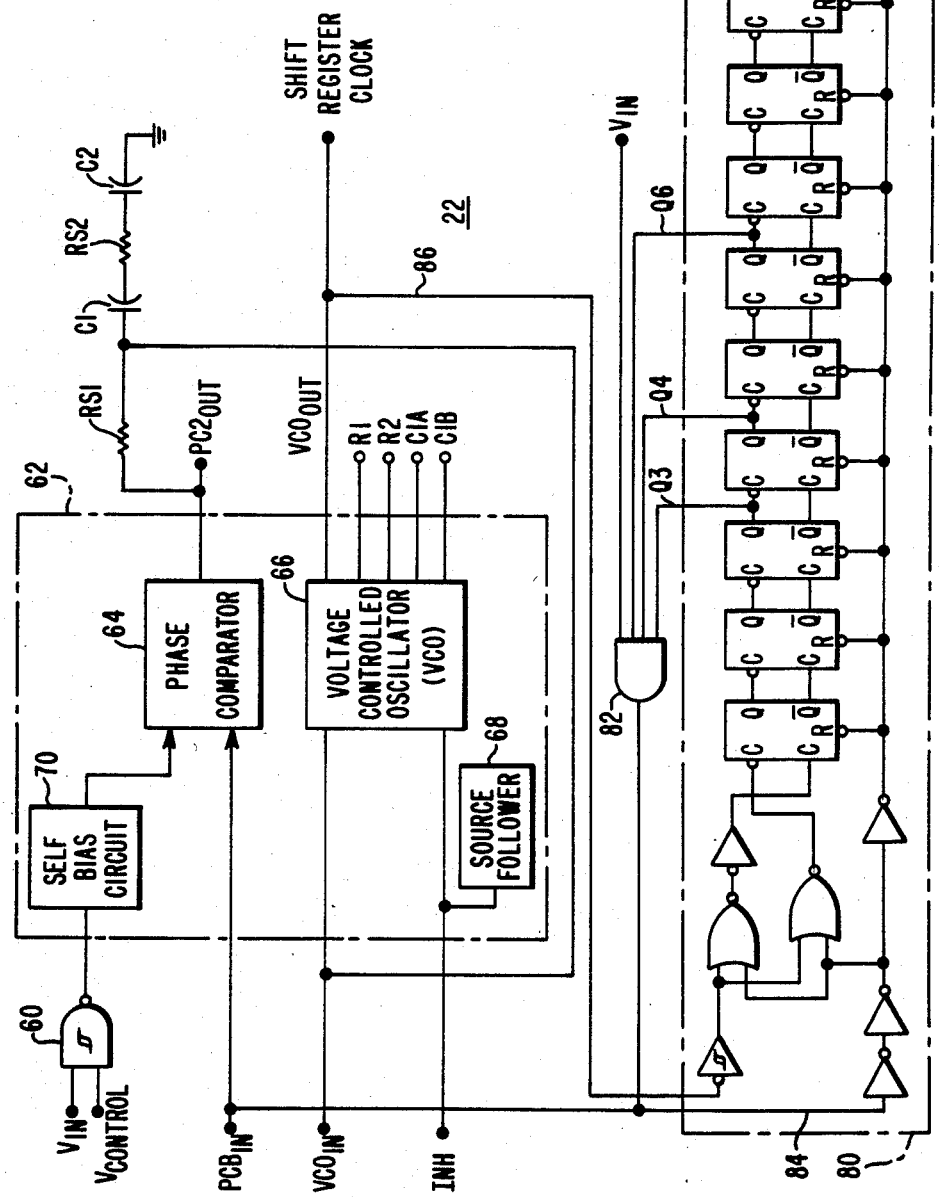
FIG. 4 is a schematic diagram of the clock used in conjunction with the shift register of the present invention.

As described above in conjunction with FIG. 1, a clock 22 is used in conjunction with the shift register 20 to provide a precise 90° delay in the pulse width modulated signal received from the modulator 14. Since the clock 22 and the shift register 20 are used to precisely delay the pulse width modulated signal by an amount that is equivalent to one-quarter cycle of the current in the metered circuit 12, the clock 22 must be functionally associated with the metered circuit 12 in order to compensate for possible changes or variations in the power frequency within the metered circuit 12. Under normal conditions, this power frequency is 60 Hz, but could vary slightly from this nominal expected frequency. Nominal power line frequencies can be expected to vary between 58 Hz and 62 Hz. According to equation 1, if a shift register with 22.5 stages is used the resulting clock frequency will therefore vary between 5,104 Hz and 5,456 Hz. When a shift register with 22.5 stages is used, as in the preferred embodiment of the present invention, these shift register frequencies will remain asynchronous with both the power line frequency and the pulse width modulated current signal frequency. FIG. 4 illustrates the components utilized to provide the clock 22.

By using a clock 22 that is capable of providing a variable frequency as a function of the power line frequency, the digital signal representing the pulse width modulating current signal will be shifted through the shift register 20 at different speeds depending on the power line frequency. The present invention uses a shift register with a predetermined number of stages. The chosen stages used for inputting and outputting the pulse width modulated current signal to and from the shift register 20 remain constant. Alternative techniques, such as that discloses in U.S. Pat. No. 4.463,311, utilize a constant clock frequency in conjunction with a shift register in which different stages of the shift register are selected as a means for providing the required time delay. In that type of system, different time delays are chosen by selecting different stages of the shift register as the output stage. When different output stages are selected, the effective time delay caused by the shift register is changed as a step function and the magnitude of the incremental time delay change is determined by the number of stages in the shift register and the frequency of the clock pulse sued to drive the shift register. The advantage of a meter made in accordance with the present invention is that it utilizes a shift register with a fixed number of stages in conjunction with a variable clock pulse frequency that can be changed continuously within a wide range of frequencies. This characteristic permits the effective time delay of the shift register to be accurately chosen with a high degree of resolution as a function of the power line frequency.

The clock 22 comprises a quad 2-input NAND Schmitt trigger 60. The Schmitt trigger is constructed with MOS P-channel and N-channel enhancement mode devices in a single monolithic structure. This type of device is primarily used where low power dissipation and high noise immunity is desired. This type of component is available in commercial quantities as type MC14093B from the Motorola Corporation. The purpose of the Schmitt trigger is to improve the shape of the signal at $V_{control}$ which provides a voltage reference. A 120 Hz parabolic waveform is derived from the power supply. This waveform is filtered by an RC network to remove the DC component and higher frequency harmonics, such as noise spikes that may be present on the power line. This filtered waveform is then applied to the Schmitt trigger, which provides a 120 Hz squarewave output. The source follower 68 and self-biased circuit 70, as well as the inhibit input, are not directly related to the present invention but are included in FIG. 4 for the purposes of completely illustrating the components of the phase-locked loop 62. The clock 22 incorporates a phase-locked loop 62 which is illustrated schematically in FIG. 4. The phase-locked loop 62 contains two phase comparators (one phase comparator 64 is illustrated in FIG. 4), a voltage-controlled oscillator (VCO) 66, a source follower 68 and a zener diode (not illustrated in FIG. 4). The self-bias circuit 70 adjusts small voltage signals in the linear region of the amplifier. The phase comparator 64, with leading-edge sensing logic, provides a digital error signal $PC2_{out}$. The linear VCO 66 produces an output signal $VCO_{out}$ whose frequency is determined by the voltage of input $VCO_{in}$ and the capacitor and resistors connected to pins R1, R2, C1A and C1B. The inhibit input INH, when high, disables the VCO and source follower to minimize standby power consumption. The phase-locked loop 62 is available in commercial quantities as type MC14046B from the Motorola Corporation.

The $VCO_{out}$ signal is used by the present invention to provide a shift register clock pulse and is also used as an input signal to a 12-bit binary counter 80. $PC2_{out}$ is connected to $VCO_{in}$ by means of a suitable filter network comprising resistors RS1 and RS2 and capacitors C1 and C2, as illustrated in FIG. 4. The binary counter 80 is illustrated schematically in FIG. 4 and is constructed with MOS P-channel and N-channel enhancement mode devices in a single monolithic structure. It is designed with an input wave shaping circuit and twelve stages of ripplecarry binary counter. The device advances the count on the negative-going edge of the clock pulse and can be used in time delay circuits, counter controls and frequency driving circuits. The twelve-bit binary counter is available in commercial quantities as type MC14040B from the Motorola Corporation. Three of the outputs from the 12-bit binary counter 80 are connected as inputs to a 4-input AND gate 82. These outputs are illustrated in FIG. 4 as Q3, Q4 and Q6. The output of the AND gate 82 is connected to the reset input of the 12-bit binary counter, by line 84, and the clock input of the binary counter 80 is connected to the $VCO_{out}$ output of the phase-locked loop 62, by line 86. The AND gate 82 is available in commercial quantities as type MC14082B from the Motorola Corporation and is constructed with P-channel and N-channel enhancement mode devices in a single monolithic structure. It is made with complementary MOS technology and its primary use is where low power dissipation and high noise immunity are desired. The clock 22 illustrated in FIG. 4 is used to provide a reliable signal with a variable frequency that is related to the frequency of the circuit 12 in such as way so as to cooperate with the number of stages in the shift register 20 to provide a constant 90° delay in the pulse width modulated signal received from the modulator 14.

Since real, or true, power $P_r$ is measured in watts and defined by equation $$P_r = VI \cos \phi \qquad (2)$$

and imaginary, or reactive, power $P_q$ is measured in volt-amperes reactive (VAR's) and defined by equation $$P_Q = VI \sin \phi \quad (3)$$

where V is the voltage in the metered circuit 12, I is the current in the metered circuit 12 and the term cos φ is dimensionless and known as the power factor, the present invention provides a means for measuring volt-amperes reactive by shifting the pulse width modulated current signal by 90° and multiplying it by the voltage in the metered circuit.

Table I illustrates the component types used to manufacture a prototype of the present invention.

TABLE I

| Reference Numeral | Component Type |
| --- | --- |
| 20 | Type CD4006B |
| 24 | Type MC14016B |
| 34 | Type MC14016B |
| 60 | Type MC14093B |
| 62 | Type MC14046B |
| 80 | Type MC14040B |
| 82 | Type MC14082B |

Although a prototype circuit of the present invention has been manufactured using the components described above, it should be understood that the present invention can also be manufactured by using one or more semi-custom, or custom, integrated circuit chips to perform the same functions as those described above in conjunction with FIG. 1. Similarly, semi-custom or custom integrated circuit chips can be used to provide the clock 22 that is illustrated in FIG. 4. Therefore, it should be understood that the specification of particular component types as shown in Table I does not limit the scope of the present invention, but merely designate one particular embodiment of the metering circuit that can be produced by using individual circuit components that are commercially available.

The present invention provides an electronic circuit that can be used to measure volt-amperes reactive of a metered circuit. Furthermore, the present invention can easily be associated with a electronic circuit for measuring real, or true, power. By using a single pulse width modulator, as illustrated in FIG. 1, a pulse width modulated current signal can be multiplied by a voltage signal to determine watts and, as a shifted waveform, can be used to be multiplied by the voltage signal to determine VAR's. Although the present invention has been described in detail relating to a single phase meter, it should be apparent, that by using a multiplicity of pulse width modulators, shift registers, and analog multipliers, a polyphase meter can be constructed within the scope of the present invention.

What I claim is:

1. A metering apparatus, comprising:
   current input means for providing a signal that is proportional to the time derivative of an alternating current in a circuit;
   first clock means for providing a first series of clock pulses, said first series of clock pulses having a generally constant frequency;
   integrating means for modulating said series of clock pulses with said signal that is proportional to said time derivative of said current, said integrating means being connected to said current input means and said first clock means, the output of said integrating means being a first pulse width modulated signal;
   means for delaying said first pulse modulated signal by a predetermined amount of time, the output of said delaying means being a second pulse width modulated signal;
   second clock means for providing a second series of clock pulses, said second clock means having an output connected to said delaying means, said second series of clock pulses having a variable frequency, said second clock means being configured to vary said variable frequency according to a preselected relationship with the frequency of said alternating current in said circuit;
   voltage input means for providing a signal that is proportional to the voltage of said circuit;
   first multiplier means for providing a signal that is proportional to the product of said second pulse width modulated signal and said signal that is proportional to the voltage of said circuit, said first multiplier means being connected to the output of said delaying means and the output of said voltage input means; and
   wherein the output of said first multiplier means is proportional to the volt-amperes reactive of said circuit.

2. The apparatus of claim 1, wherein:
   said delaying means comprises a shift register.

3. The apparatus of claim 1, wherein:
   said predetermined amount of time is equivalent to one-fourth of the period of one cycle of said alternating current.

4. The apparatus of claim 1, wherein:
   said second clock means comprises a phase locked loop.

5. The apparatus of claim 1, further comprising:
   a first voltage-to-frequency converter connected to said first multiplier means, said first voltage-to-frequency converter providing an output signal comprising a first plurality of pulses, each of said first plurality of pulses from said first voltage-to-frequency converter representing a predetermined quantity of volt-amperes reactance.

6. The apparatus of claim 5, further comprising:
   a first counter connected to said first voltage-to-frequency converter, said first counter being configured to accumulate a count of said first plurality of pulses from said first voltage-to-frequency converter.

7. The apparatus of claim 1, further comprising:
   second multiplier means for providing a signal that is proportional to the product of said first pulse width modulated signal and said signal that is proportional to the voltage of said circuit, said second multiplier means being connected to the output of said integrating means and the output of said voltage input means; and
   wherein the output of said second multiplier means is proportional to watts of said circuit.

8. The apparatus of claim 7, further comprising:
   a second voltage-to-frequency converter connected to said second multiplier means, said second voltage-to-frequency converter providing an output signal comprising a second plurality of pulses, each of said second plurality of pulses from said second voltage-to-frequency converter representing a predetermined quantity of watts.

9. The apparatus of claim 8, further comprising:
   a second counter connected to said second voltage-to-frequency converter, said counter being configured to accumulate a count of said second plurality of pulses from said second voltage-to-frequency converter.

* * * * *